United States Patent
Chen et al.

(10) Patent No.: US 9,942,062 B2
(45) Date of Patent: Apr. 10, 2018

(54) UNLOCK DETECTOR, UNLOCK-DETECTING METHOD AND CLOCK AND DATA RECOVERY CIRCUIT

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Yu-Chu Chen, Hsinchu (TW); Wen-Juh Kang, Hsinchu (TW); Cheng-Hung Wu, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/468,127

(22) Filed: Mar. 24, 2017

(65) Prior Publication Data
US 2018/0013593 A1 Jan. 11, 2018

(30) Foreign Application Priority Data
Jul. 11, 2016 (CN) .......................... 2016 1 0541515

(51) Int. Cl.
| | |
|---|---|
| H04L 25/03 | (2006.01) |
| H04L 12/26 | (2006.01) |
| H03L 7/08 | (2006.01) |
| H03K 19/21 | (2006.01) |
| H04L 7/00 | (2006.01) |
| H04L 7/033 | (2006.01) |

(52) U.S. Cl.
CPC ....... *H04L 25/03273* (2013.01); *H03K 19/21* (2013.01); *H03L 7/0807* (2013.01); *H04L 7/0033* (2013.01); *H04L 7/033* (2013.01); *H04L 7/0331* (2013.01); *H04L 43/16* (2013.01)

(58) Field of Classification Search
CPC ....... H04L 7/0033; H04L 43/16; H04L 7/033; H04L 7/0331
See application file for complete search history.

(56) References Cited

U.S. PATENT DOCUMENTS

| | | | | |
|---|---|---|---|---|
| 4,457,005 A | * | 6/1984 | Burke | H04L 27/2338 329/310 |
| 4,754,467 A | * | 6/1988 | Banwart | H04L 1/20 375/340 |
| 5,299,237 A | * | 3/1994 | Head | H04L 7/0331 327/141 |

(Continued)

*Primary Examiner* — Jean B Corrielus
(74) *Attorney, Agent, or Firm* — CKC & Partners Co., Ltd.

(57) ABSTRACT

An unlock detector includes a checker, an accumulator, and a comparator. The accumulator is electrically connected to the checker, and the comparator is electrically connected to the accumulator. The checker includes several checking units. The checker is configured to receive a sampled data signal and a sampled edge signal, and to check the sampled data signal and the sampled edge signal via the checking units to generate several checking results. The accumulator is configured to generate a counting value in a manner of counting according to the checking results. The comparator is configured to compare the counting value with a threshold to generate an unlock-detecting result.

12 Claims, 9 Drawing Sheets

(56) References Cited

U.S. PATENT DOCUMENTS

| | | | | |
|---|---|---|---|---|
| 6,633,201 | B1* | 10/2003 | Milton | H03L 7/087 |
| | | | | 327/156 |
| 2006/0087352 | A1* | 4/2006 | Byun | G01R 23/005 |
| | | | | 327/156 |
| 2006/0280276 | A1* | 12/2006 | Chen | H03L 7/095 |
| | | | | 375/376 |
| 2009/0122935 | A1* | 5/2009 | Pang | H03L 7/095 |
| | | | | 375/360 |
| 2010/0164569 | A1* | 7/2010 | Bode | H03K 5/1252 |
| | | | | 327/156 |
| 2010/0309791 | A1* | 12/2010 | Fuller | H04L 1/20 |
| | | | | 370/242 |
| 2010/0322367 | A1* | 12/2010 | Wenske | H03L 7/0807 |
| | | | | 375/373 |
| 2017/0093558 | A1* | 3/2017 | Ramezani | H04L 25/03057 |
| 2017/0093588 | A1* | 3/2017 | Mizikovsky | H04L 9/3271 |

\* cited by examiner

UNLOCK DETECTOR, UNLOCK-DETECTING METHOD AND CLOCK AND DATA RECOVERY CIRCUIT

RELATED APPLICATIONS

This application claims priority to Chinese Application Serial Number 201610541515.1, filed Jul. 11, 2016, which is herein incorporated by reference.

BACKGROUND

Field of Invention

The present disclosure relates to a detector, a detecting method and a data processing circuit. More particularly, the present disclosure relates to an unlock detector, an unlock-detecting method and a clock and data recovery circuit.

Description of Related Art

With the rapid advances of signal transmission technology, recovery accuracy of received signals is playing an increasingly important role. To accurately recover the received signals, most current methodology suggests disposing a clock and data recovery (CDR) circuit in a receiver so as to enhance the recovery accuracy of the received signals.

However, when the clock and data recovery circuit operates at a wrong sampling rate, the recovery accuracy of the received signals is dramatically reduced. To avoid the above-mentioned condition, an unlock detector is commonly disposed in the clock and data recovery circuit to detect an unlock state of the sampling rate according to a reference clock signal. Although the unlock detector can effectively avoid the clock and data recovery circuit operating at the wrong sampling rate, a circuit which is correspondingly disposed for generating the reference dock signal may result in increasing an area of the clock and data recovery circuit, and this increase of area is obviously contrary to the current popular trend of decreasing the area of a circuit.

Accordingly, a significant challenge is related to ways in which to maintain the function of detecting unlock while at the same time decreasing the area of the clock and data recovery circuit associated with designing unlock detectors.

SUMMARY

An aspect of the present disclosure is directed to an unlock detector. The unlock detector includes a checker, an accumulator, and a comparator. The accumulator is electrically connected to the checker, and the comparator is electrically connected to the accumulator. The checker includes several checking units. The checker is configured to receive a sampled data signal and a sampled edge signal, and to check the sampled data signal and the sampled edge signal via the checking units to generate several checking results. The accumulator is configured to generate a counting value in a manner of counting according to the checking results. The comparator is configured to compare the counting value with a threshold to generate an unlock-detecting result.

Another aspect of the present disclosure is directed to an unlock-detecting method. The unlock-detecting method includes operations as follows: receiving a sampled data signal and a sampled edge signal; checking according to the sampled data signal and the sampled edge signal to generate a plurality of checking results; generating a counting value in a manner of counting according to the checking results in a period; and comparing the counting value with a threshold to generate an unlock-detecting result.

Still another aspect of the present disclosure is directed to a clock and data recovery circuit. The clock and data recovery circuit includes a signal sampler, a phase detector, a loop filter, a phase adjuster, a clock signal generator and an unlock detector. The signal sampler is configured to generate a sampled data signal and a sampled edge signal according to a data signal and a clock signal. The phase detector is configured to generate an error signal according to the sampled data signal and the sampled edge signal. The loop filter is configured to generate an adjusting signal according to the error signal. The phase adjuster is configured to generate a renewal signal according to the adjusting signal. The clock signal generator is configured to generate the clock signal and adjust the clock signal according to the renewal signal. The unlock detector includes a checker, an accumulator, and a comparator. The accumulator is electrically connected to the checker, and the comparator is electrically connected to the accumulator. The checker includes several checking units. The checker is configured to receive a sampled data signal and a sampled edge signal, and to check the sampled data signal and the sampled edge signal via the checking units to generate several checking results. The accumulator is configured to generate a counting value in a manner of counting according to the checking results. The comparator is configured to compare the counting value with a threshold to generate an unlock-detecting result.

It is to be understood that the foregoing general description and the following detailed description are by examples, and are intended to provide further explanation of the invention as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1A:
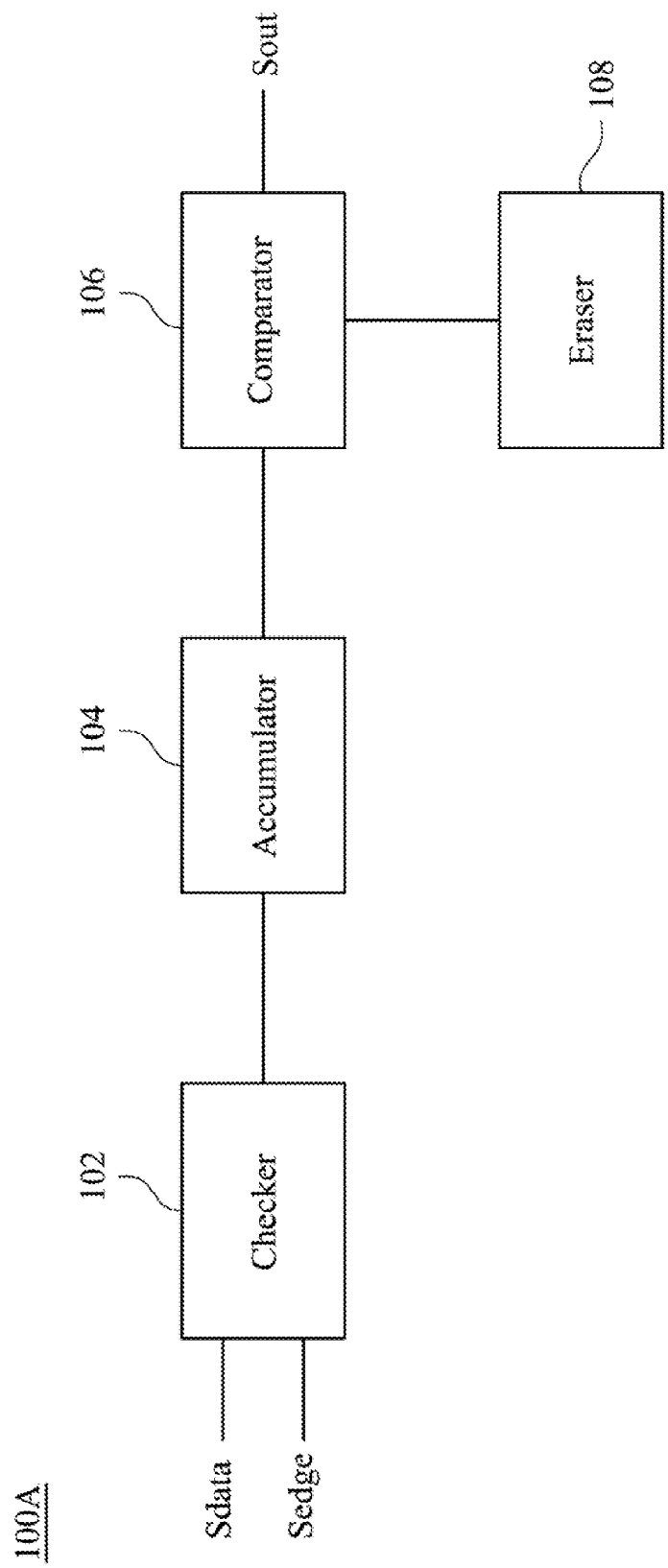
FIG. 1A is a block diagram of an unlock detector according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another elements) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a block diagram of an unlock detector 100A according to embodiments of the present disclosure. As shown in FIG. 1A, the unlock detector 100A includes a checker 102, an accumulator 104 and a comparator 106. The accumulator 104 is electrically connected to the checker 102, and the comparator 106 is electrically connected to the accumulator 104.

Figure 1B:
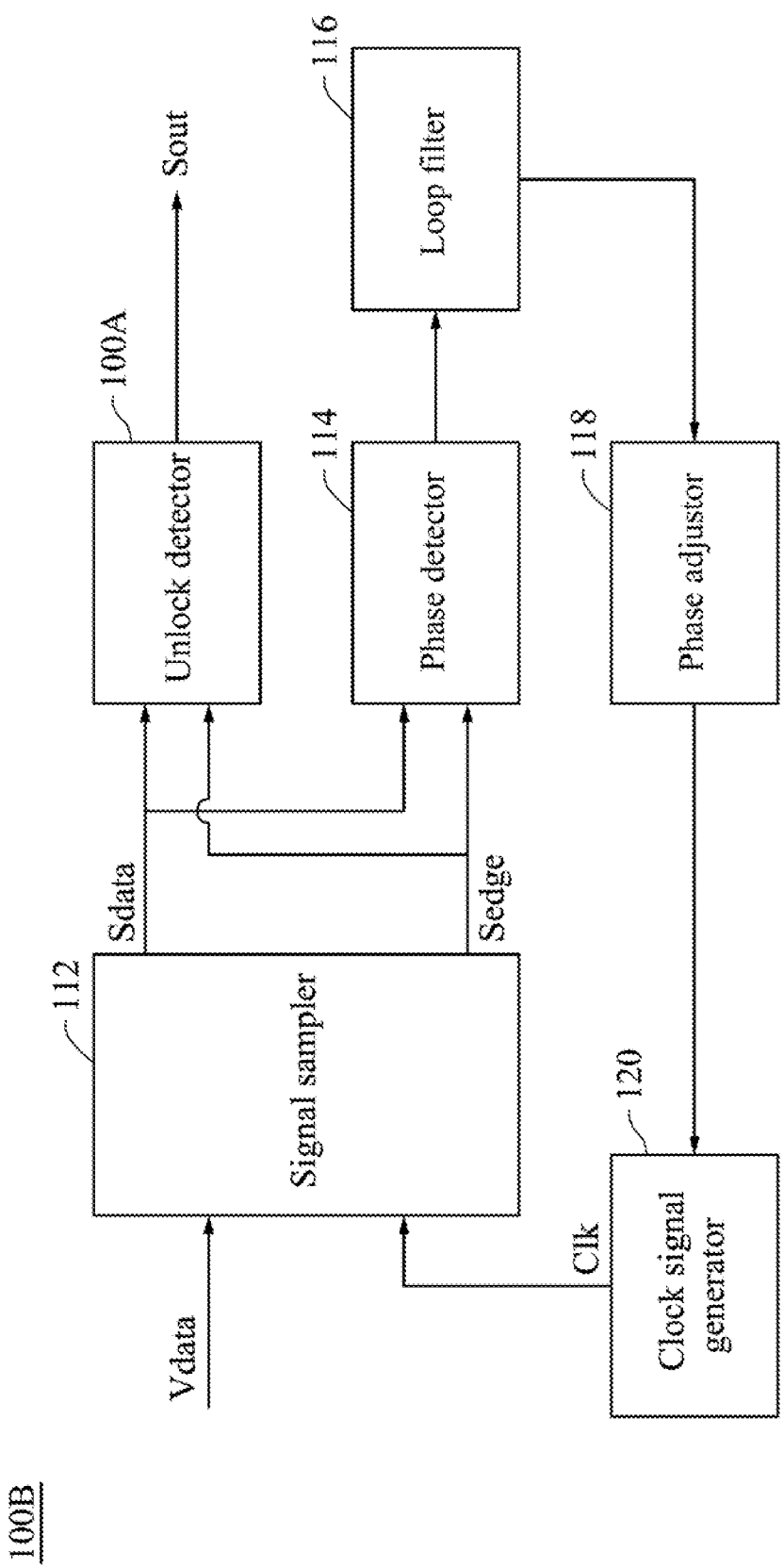
FIG. 1B is a block diagram of a clock and data recovery circuit according to embodiments of the present disclosure.

The checker 102 includes several checking units (not depicted in FIG. 1A), and the checker 102 is configured to receive a sampled data signal Sdata and a sampled edge signal Sedge generated from a clock and data recovery circuit (as shown in FIG. 1B, a clock and data recovery circuit 100B), and to respectively check the sampled data signal Sdata and the sampled edge signal Sedge via the checking units to generate several checking results. The accumulator 104 is configured to generate a counting value in a manner of counting according to the checking results, and the counting value is a nonnegative integer. For example, the checking result can be a binary number (that is, a number 0 or a number 1). When the checking result represents a binary number 1, the accumulator 104 increases the number of the counting value according to the checking result; when the checking result represents a binary number 0, the accumulator 104 remains the number of the counting value according to the checking result. The comparator 106 generates an unlock-detecting result according to the counting value and a default threshold.

In one embodiment, firstly, each of the checking units of the checker 102 executes a logical exclusive NOR (XNOR) operation for a first sampled data signal and a second sampled data signal of the sampled data signal Sdata to generate a first output. Subsequently, each of the checking units executes a logical exclusive OR (XOR) operation for the second sampled data signal of the sampled data signal Sdata and a first sampled edge signal of the sampled edge signal Sedge to generate a second output. Finally, each of the checking units executes a logical AND operation for the first output and the second output to generate the checking results. For example, the first sampled data signal and the second sampled data signal are signals retrieved from the sampled data signal Sdata, the first sampled edge signal is a signal retrieved from the sampled edge signal Sedge, and there is a timing difference between the first sampled data signal and the second sampled data signal. Additionally, there are timing differences among the first sampled data signal, the first sampled edge signal and the second sampled data signal received by the different checking units.

In one embodiment, after the comparator 106 generates the unlock-detecting result Sout, the unlock detector 100A is configured to determine whether an unlock state is incurred or not. When the unlock-detecting result Sout represents that the counting value is larger than the default threshold, the unlock detector 100A determines that the unlock state is incurred; when the unlock-detecting result Sout represents that the counting value is smaller than the default threshold, the unlock detector 100A determines that the unlock state is not incurred. It should be noted that, the representation of the unlock-detecting result Sout mentioned above is for illustration, but the present disclosure is not limited thereto.

In one embodiment, the unlock detector 100A further includes an eraser 108, and the eraser 108 is electrically connected to the comparator 106. The eraser 108 is configured to erase the unlock-detecting result Sout generated from the comparator 106, so as to reset the comparator 106. For example, after the comparator 106 generates the unlock-detecting result Sout, and the unlock detector 100A determines that the unlock state is not incurred, the unlock-detecting result Sout is erased by the eraser 108, so as to reactivate the unlock detector 100A to detect the unlock state. In contrast, after the comparator 106 generates the unlock-detecting result Sout, and the unlock detector 100A determines that the unlock state is incurred, the clock and data recovery circuit immediately stops operating and corrects the unlock state.

FIG. 1B is a block diagram of a clock and data recovery circuit 100B according to embodiments of the present disclosure. In one embodiment, the unlock detector 100A can be implemented in the clock and data recovery circuit 100B, but the present disclosure is not limited thereto. The clock and data recovery circuit 100B includes a signal sampler 112, a phase defector 114, a loop filter 118, a phase adjuster 118, a clock signal generator 120 and the unlock detector 100A.

The signal sampler 112 is configured to receive a data signal Vdata and a clock signal Clk to generate the sampled data signal Sdata and the sampled edge signal Sedge according to the data signal Vdata and the clock signal Clk, and to transmit the sampled data signal Sdata and the sampled edge signal Sedge to the unlock detector 100A and the phase detector 114. The phase detector 114 is configured to compare phase differences between the sampled data signal Sdata and the sampled edge signal Sedge to generate an error signal, and to transmit the error signal to the loop filter 116. The loop filter 116 is configured to receive the error signal to generate an adjusting signal according to the error signal, and to transmit the adjusting signal to the phase adjuster 118. The phase adjuster 118 is configured to receive the adjusting signal to generate a renewal signal according to the adjusting signal, and to transmit the renewal signal to the clock signal generator 120. The clock signal generator 120 is configured to generate the clock signal Clk mentioned above, and to adjust a frequency or a phase of the clock signal Clk according to the renewal signal.

In one embodiment, after the unlock detector 100A of the clock and data recovery circuit 100B receives the sampled data signal Sdata and the sampled edge signal Sedge to generate the unlock-detecting result Sout according to the sampled data signal Sdata and the sampled edge signal Sedge, and the unlock detector 100A determines that the unlock state is not incurred, the unlock-detecting result Sout is erased by the eraser 108 disposed in the unlock detector 100A, so as to reactivate the unlock detector 100A to detect the unlock state. After the unlock detector 100A of the clock and data recovery circuit 100B receives the sampled data signal Sdata and the sampled edge signal Sedge to generate the unlock-detecting result Sout according to the sampled data signal Sdata and the sampled edge signal Sedge, and the unlock detector 100A determines that the unlock state is incurred, the clock and data recovery circuit 100B immediately stops operating and corrects the unlock state.

Figure 1C:
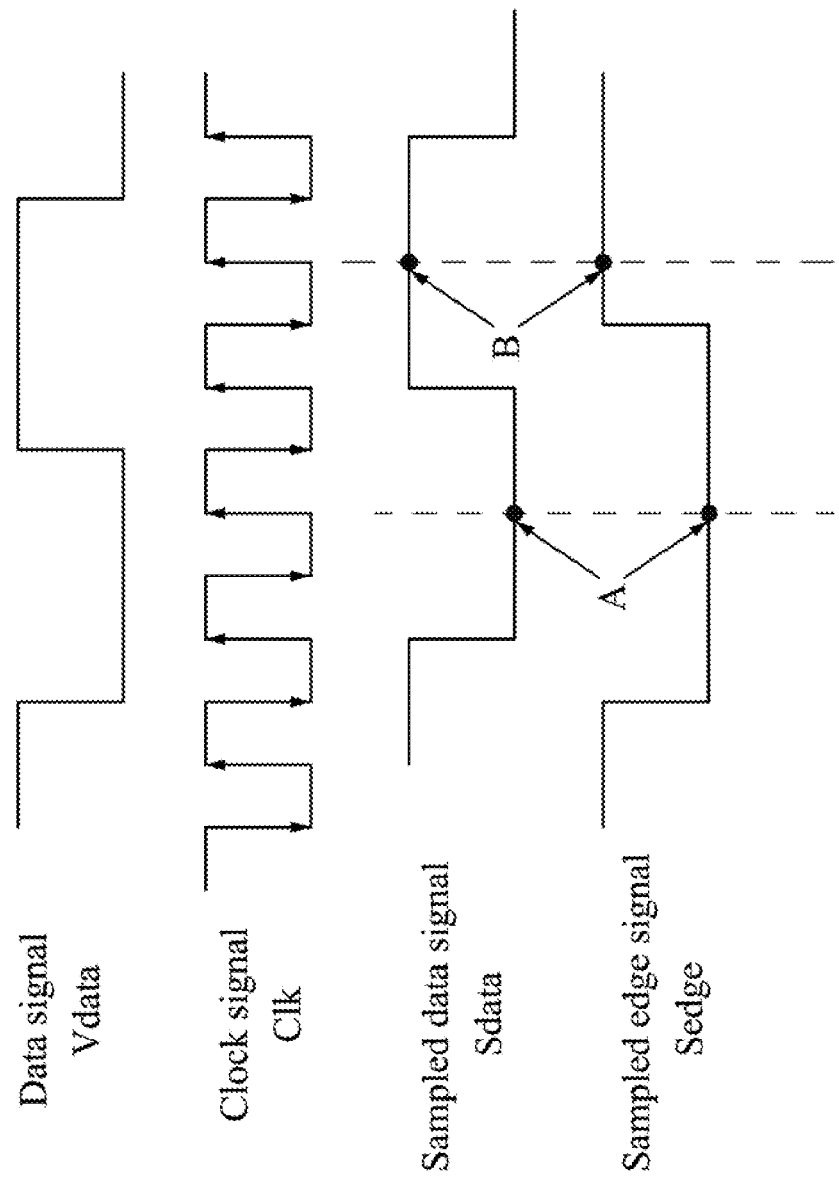
FIG. 1C is a wave schematic diagram of the clock and data recovery circuit under correct sampling according to embodiments of the present disclosure.
Figure 1D:
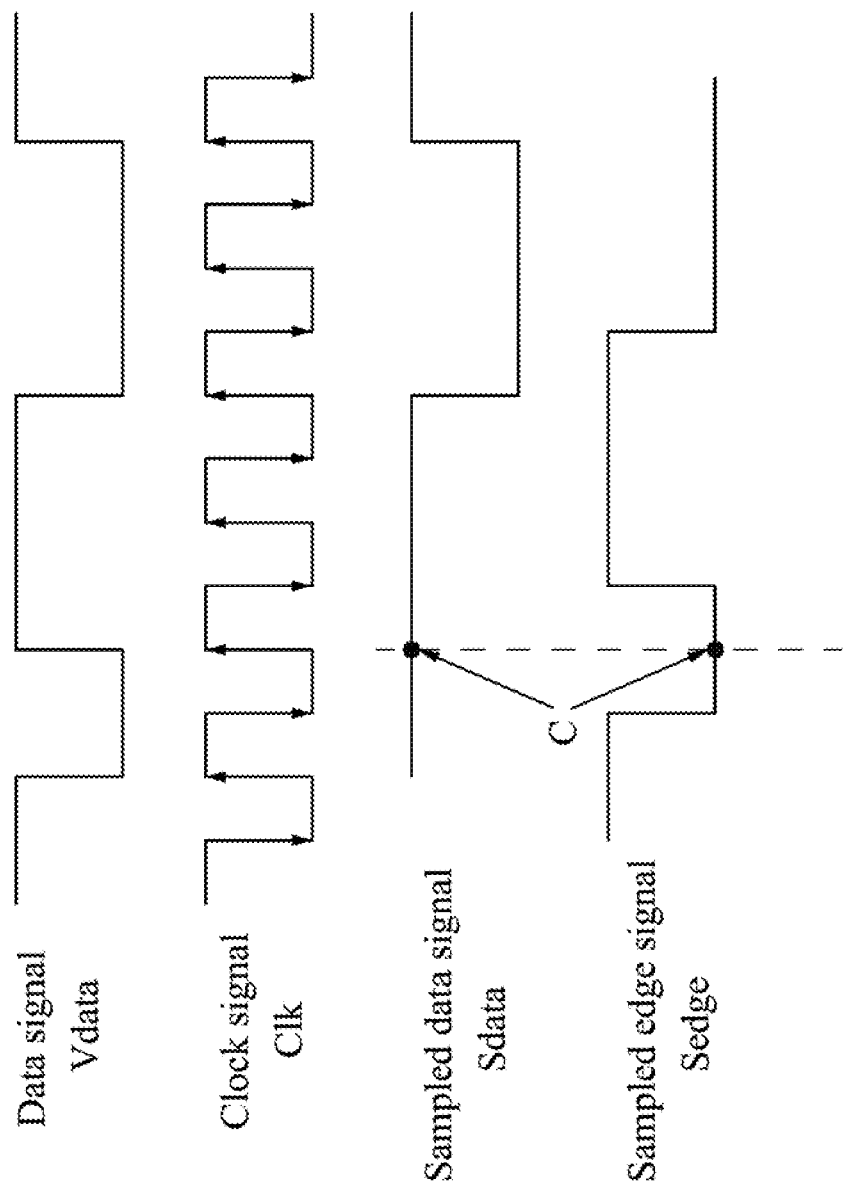
FIG. 1D is a wave schematic diagram of the clock and data recovery circuit under incorrect sampling according to embodiments of the present disclosure.

FIG. 1C is a wave schematic diagram of the clock and data recovery circuit 100B under correct sampling according to embodiments of the present disclosure, and FIG. 1D is a wave schematic diagram of the clock and data recovery circuit 100B under incorrect sampling according to embodiments of the present disclosure. As shown in FIG. 1C and FIG. 1D, when the clock signal Clk is located at a rising edge, the signal sampler 112 of the clock and data recovery circuit 100B samples the data signal Vdata according to timing corresponding to the rising edge, so as to generate the sampled data signal Sdata; when the clock signal Clk is located at a falling edge, the signal sampler 112 of the clock and data recovery circuit 100B samples the data signal Vdata according to timing corresponding to the falling edge, so as to generate the sampled edge signal Sedge.

In one embodiment, reference is now made to FIG. 1C, the checker 102 of the unlock detector 100A checks the sampled data signal Sdata and the sampled edge signal Sedge at a checking point A to determine that each of the sampled data signal Sdata and the sampled edge signal Sedge has a low level voltage (that is, a logic signal 0) at the checking point A, and checks the sampled data signal Sdata and the sampled edge signal Sedge at a checking point B to determine that each of the sampled data signal Sdata and the sampled edge signal Sedge has a high level voltage (that is, a logic signal 1) at the checking point B. Therefore, in this embodiment, the checker 102 of the unlock detector 100A determines that the unlock state is not incurred. In other words, when the unlock state is not incurred, there is only a timing difference between the sampled data signal Sdata and the sampled edge signal Sedge, and a waveform corresponding to the sampled data signal Sdata is similar to the sampled edge signal Sedge. It should be noted that, although the above-mentioned embodiment determines whether the unlock state is incurred or not merely according to the checking point A and the checking point B, but it can determine whether the unlock state is incurred or not according to different checking points in practical operations.

In another embodiment, reference is now made to FIG. 1D, the checker 102 of the unlock detector 100A checks the sampled data signal Sdata at a checking point C to determine that the sampled data signal Sdata has a high level voltage (that is, a logic signal 1), and checks the sampled edge signal Sedge at the checking point C to determine that the sampled edge signal Sedge has a low level voltage (that is, a logic signal 0). Therefore, in this embodiment, the checker 102 of the unlock detector 100A determines that the unlock state is incurred. In other words, when the unlock state is incurred, there is a timing difference between the sampled data signal Sdata and the sampled edge signal Sedge, and a waveform corresponding to the sampled data signal Sdata is different from the sampled edge signal Sedge. It should be noted that, although the above-mentioned embodiment merely determines whether the unlock state is incurred or not according to the checking point C, but it can determine whether the unlock state is incurred or not according to different checking points in practical operations.

Figure 2A:
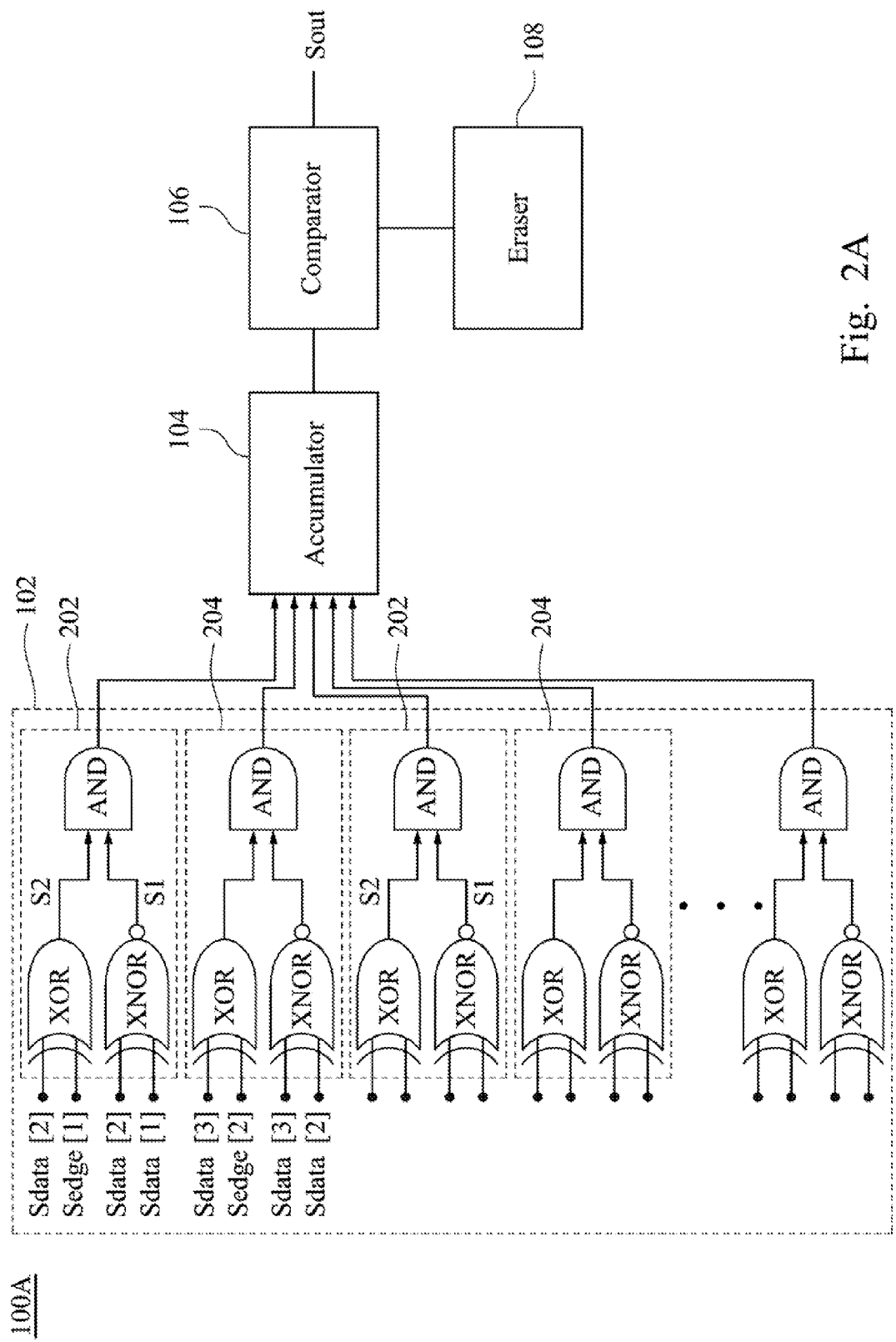
FIG. 2A is a circuit schematic diagram of a checker of an unlock detector according to embodiments of the present disclosure.

FIG. 2A is a circuit schematic diagram of a checker 102 of an unlock detector 100A according to embodiments of the present disclosure. As shown in FIG. 2A, the checker 102 includes several checking units 202 and several checking units 204. Each of the checking units 202/204 includes a logical AND gate AND, a logical exclusive OR gate XOR and a logical exclusive NOR gate XNOR. Each of the checking units 202 is parallel with each other, each of the checking units 204 is parallel with each other, and the checking units 202 are parallel with the checking units 204. The logical AND gate AND is electrically connected to the accumulator 104, the logical exclusive OR gate XOR and the logical exclusive NOR gate XNOR are electrically connected to the logical AND gate AND, and the logical exclusive OR gate XOR is parallel with the logical exclusive NOR gate XNOR. For example, since each of the checking units 202 is parallel with each other, each of the checking units 204 is parallel with each other, and the checking units 202 are parallel with the checking units 204, the checker 102 can check according to the sampled data signal Sdata and the sampled edge signal Sedge simultaneously to generate several checking results, so as to dramatically decrease time of checking.

In one embodiment, the logical exclusive NOR gate XNOR is configured to receive a first sampled data signal and a second sampled data signal of the sampled data signal Sdata, and to execute a logical exclusive NOR operation for the first sampled data signal and the second sampled data signal to generate a first output S1. The logical exclusive OR gate XOR is configured to receive the second sampled data signal of the sampled data signal Sdata and a first sampled edge signal of the sampled edge signal Sedge, and to execute a logical exclusive OR operation for the second sampled data signal and the first sampled edge signal to generate a second output S2. The logical AND gate AND is configured to receive the first output S1 and the second output S2, and to execute a logical AND operation for the first output S1 and the second output S2, so as to generate the checking results.

For example, the first sampled data signal and the second sampled data signal are signals retrieved from the sampled data signal Sdata, the first sampled edge signal is a signal retrieved from the sampled edge signal Sedge, and there is a timing difference between the first sampled data signal and the second sampled data signal. As shown in FIG. 2A, there are timing differences among the first sampled data signal, the first sampled edge signal and the second sampled data signal received by the checking unit 202 and the checking unit 204. The checking unit 202 is configured to receive the first sampled data signal Sdata[1], the first sampled edge signal Sedge[1] and the second sampled data signal Sdata[2], and the checking unit 204 is configured to receive the first sampled data signal Sdata[2], the first sampled edge signal Sedge[2] and the second sampled data signal Sdata[3]. In other words, retrieving timing corresponding to the first sampled data signal Sdata[2], the first sampled edge signal Sedge[2] and the second sampled data signal Sdata[3] received by the checking unit 204 can be earlier or later than the first sampled data signal Sdata[1], the first sampled edge signal Sedge[1] and the second sampled data signal Sdata[2] received by the checking unit 202. It should be noted that, the timing relation among the signals received by the checking units 202 and the checking units 204 mentioned above is used for illustration, but the present disclosure is not limited thereto.

Figure 2B:
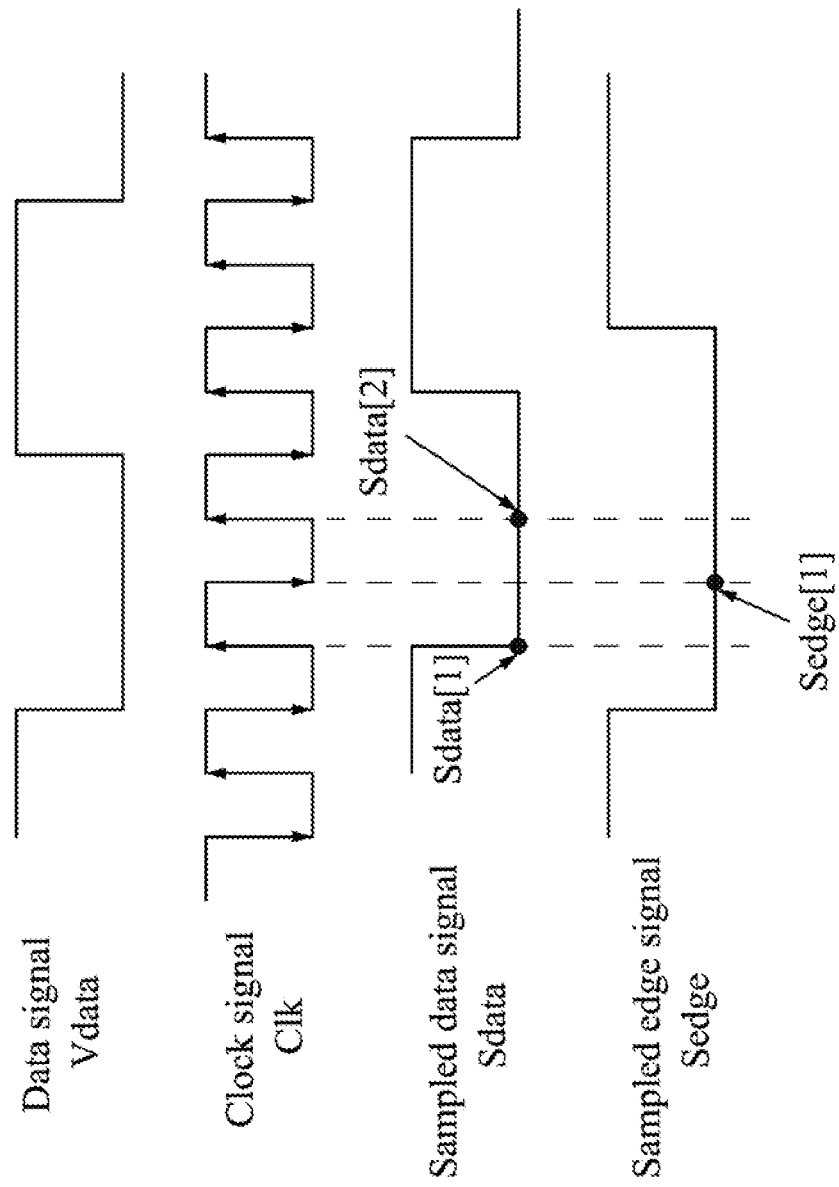
FIG. 2B is a wave schematic diagram of a clock and data recovery circuit under correct sampling according to embodiments of the present disclosure.

FIG. 2B is a wave schematic diagram of a clock and data recovery circuit 100B under correct sampling according to embodiments of the present disclosure. In one embodiment, as shown in FIG. 2B, when each of the first sampled data signal Sdata[1], the second sampled data signal Sdata[2] and the first sampled edge signal Sedge[1] represents a low level signal, the logical exclusive NOR gate XNOR of the checking unit 202 executes the logical exclusive NOR operation for the first sampled data signal Sdata[1] and the second sampled data signal Sdata[2] to generate the first output S1 having a high level; the logical exclusive OR gate XOR of the checking unit 202 executes the logical exclusive OR operation for the second sampled data signal Sdata[2] and the first sampled edge signal Sedge[1] to generate the second output S2 having a low level. Therefore, the logical AND gate AND of the checking unit 202 executes the logical AND operation for the first output S1 having the high level and the second output S2 having the low level, so as to generate the checking result having a low level. In another embodiment, the logical exclusive OR gate XOR of the checking unit 202 can execute the logical exclusive OR operation for the first sampled data signal Sdata[1] having a low level and the first sampled edge signal Sedge[1] having a low level to generate the second output S2 having the low level. In this embodiment, when the checking result represents a low level signal, the accumulator 104 stops counting.

Figure 2C:
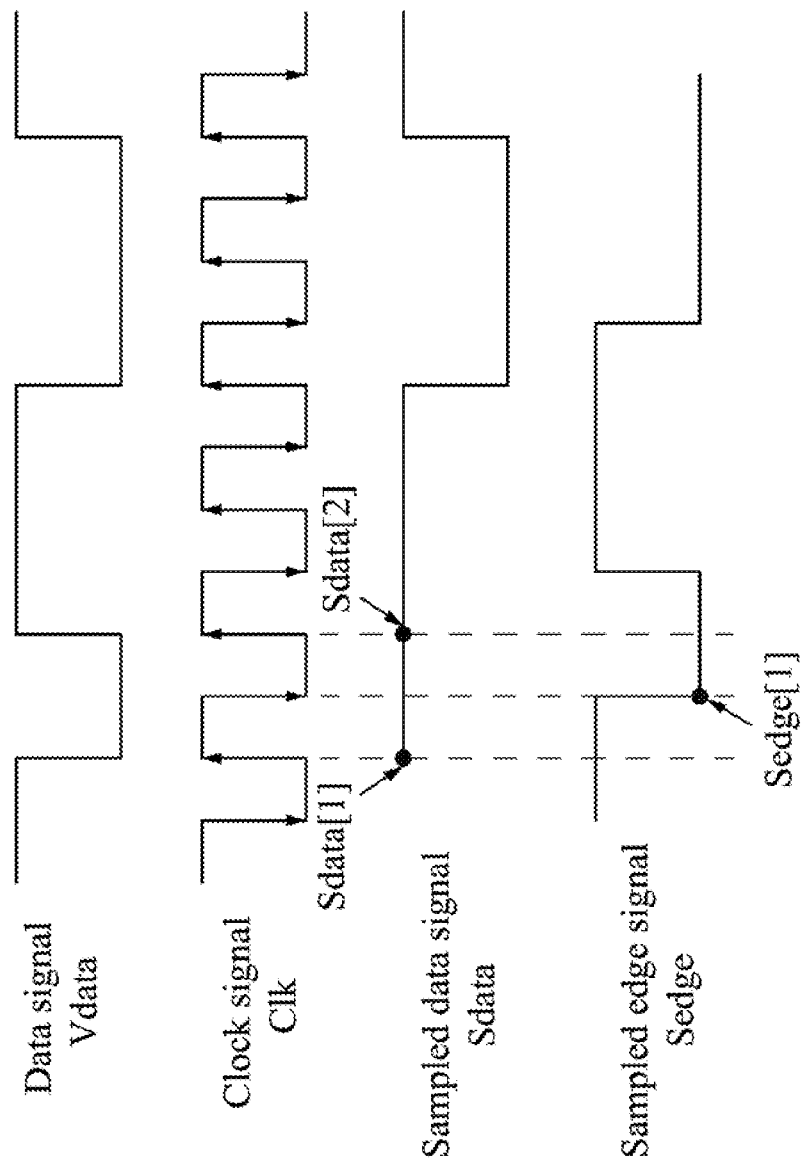
FIG. 2C is a wave schematic diagram of the clock and data recovery circuit under incorrect sampling according to embodiments of the present disclosure.

FIG. 2C is a wave schematic diagram of the clock and data recovery circuit 100B under incorrect sampling according to embodiments of the present disclosure. In one embodiment, as shown in FIG. 2C, when each of the first sampled data signal Sdata[1] and the second sampled data signal Sdata[2] represents a high level signal, and the first sampled edge signal Sedge[1] represents a low level signal, the logical exclusive NOR gate XNOR of the checking unit 202 executes the logical exclusive NOR operation for the first sampled data signal Sdata[1] and the second sampled data signal Sdata[2] to generate the first output S1 having a high level; the logical exclusive OR gate XOR of the checking unit 202 executes the logical exclusive OR operation for the second sampled data signal Sdata[2] and the first sampled edge signal Sedge[1] to generate the second output S2 having a high level. Therefore, the logical AND gate AND of the checking unit 202 executes the logical AND operation for the first output S1 having the high level and the second output S2 having the high level, so as to generate the checking result having a high level. In another embodiment, the logical exclusive OR gate XOR of the checking unit 202 can execute the logical exclusive OR operation for the first sampled data signal Sdata[1] having a high level and the first sampled edge signal Sedge[1] having a low level to generate the second output S2 having the high level. In this embodiment, when the checking result represents a high level signal, the accumulator 104 counts according to the checking result having the high level.

Figure 2D:
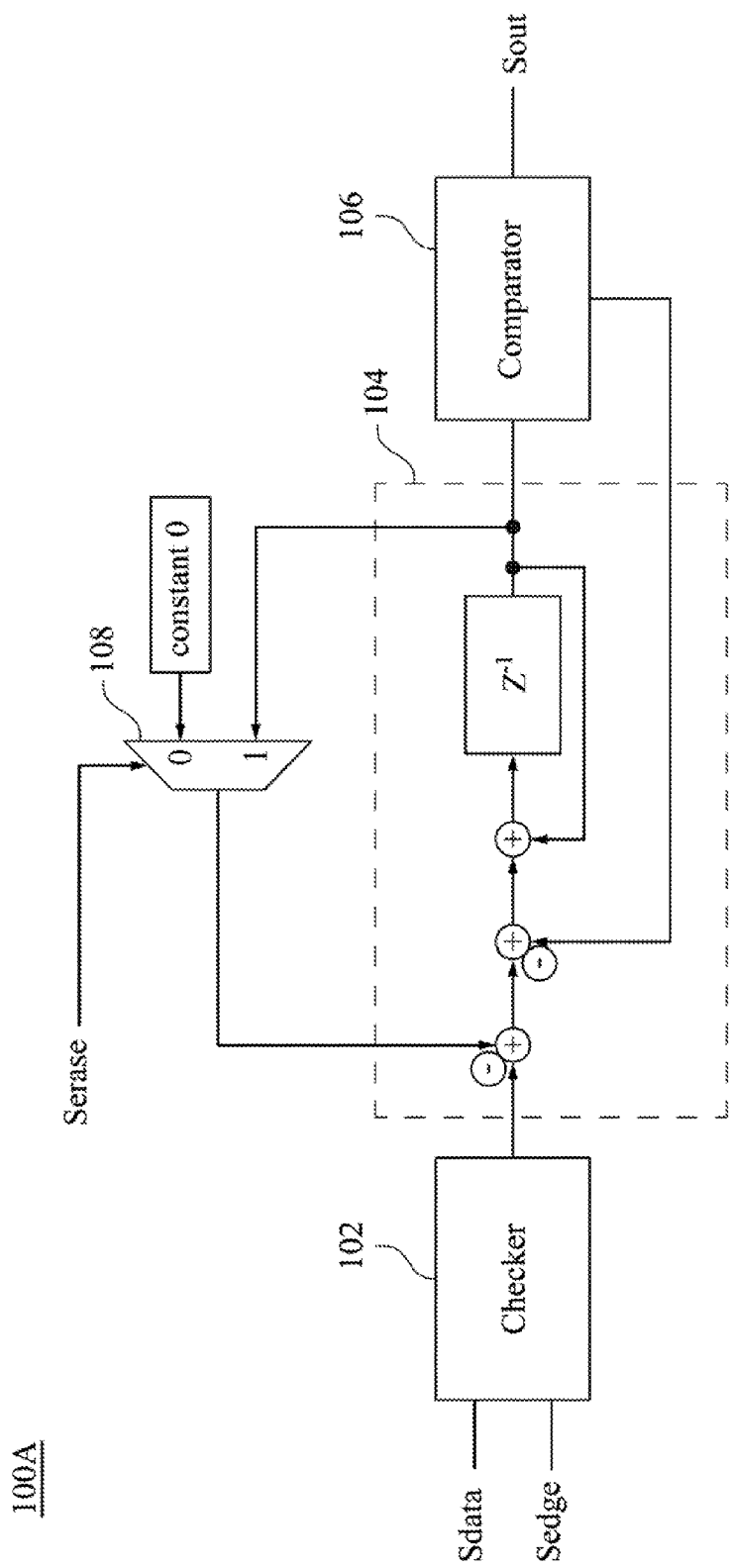
FIG. 2D is a circuit schematic diagram of an accumulator of the unlock detector according to embodiments of the present disclosure.

FIG. 2D is a circuit schematic diagram of an accumulator 104 of the unlock detector 100A according to embodiments of the present disclosure. As shown in FIG. 2D, the accumulator 104 includes an adding unit, a subtracting unit and a delay unit. The accumulator 104 is configured to receive the checking results mentioned above to generate a non-negative integer counting value in a manner of counting. It should be noted that, the specific arrangements of the accumulator 104 mentioned above is for illustration one possible manner of implementing an accumulator, but the present disclosure is not limited thereto. In one embodiment, the function of the eraser 108 can be implemented by a multiplexer (MUX). The eraser 108 is configured to receive an erasing signal Serase, and to reset a counting result of the accumulator 104 to zero according to the erasing signal Serase, so as to reactivate the unlock detector 100A to detect the unlock state.

Figure 3:
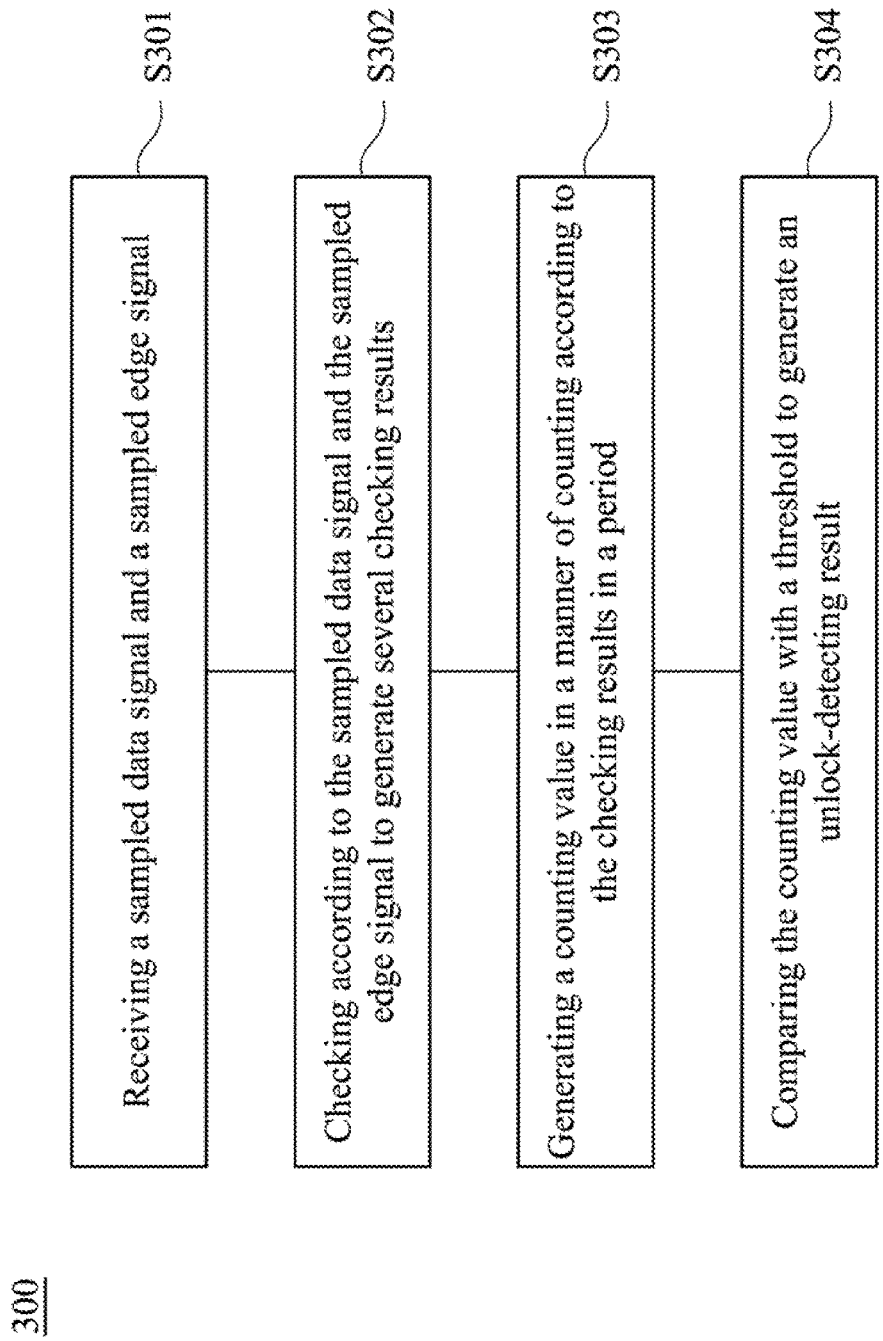
FIG. 3 is a flow chart of an unlock-detecting method according to embodiments of the present disclosure.

FIG. 3 is a flow chart of an unlock-detecting method 300 according to embodiments of the present disclosure. In one embodiment, the unlock-detecting method 300 can be implemented by the unlock detector 100A mentioned above, but the present disclosure is not limited thereto. For facilitating of understanding the unlock-detecting method 300, the unlock detector 100A is used for illustration the unlock-detecting method 300.

As shown in FIG. 3, firstly, in an operation S301, it is receiving the sampled data signal Sdata and the sampled edge signal Sedge via the checker 102. In an operation S302, it is checking according to the sampled data signal Sdata and the sampled edge signal Sedge via the checker 102, so as to generate several checking results. In an operation S303, it is generating a counting value in a manner of counting via the accumulator 104 according to the checking results in a period. For example, the checking result can be a binary number (that is, a number 0 or a number 1). When the checking result represents a binary number 1, the accumulator 104 increases the number of the counting value according to the checking result; when the checking result represents a binary number 0, the accumulator 104 remains the number of the counting value according to the checking result. Finally, in an operation S304, it is comparing the counting value with a default threshold via the comparator 106 to generate the unlock-detecting result Sout.

In one embodiment, reference is now made to the operation S302, when it is checking according to the sampled data signal Sdata and the sampled edge signal Sedge via the checker 102, the checker 102 retrieves the first sampled data signal, the second sampled data signal of the sampled data signal Sdata and the first sampled edge signal of the sampled edge signal Sedge, and generate the first output S1 and the second output S2 according to the first sampled data signal, the first sampled edge signal and the second sampled data signal. Subsequently, it is generating the checking results via the checker 102 according to the first output S1 and the second output S2. For example, the first sampled data signal and the second sampled data signal are signals retrieved from the sampled data signal Sdata, the first sampled edge signal is a signal retrieved from the sampled edge signal Sedge, and there is a timing difference between the first sampled data signal and the second sampled data signal. Additionally, the checker 102 includes several checking units. There are timing differences among the first sampled data signal, the first sampled edge signal and the second sampled data signal received by the different checking units.

In another embodiment, reference is now made to the operation S302, firstly, it is executing the logical exclusive NOR operation for the first sampled data signal and the second sampled data signal via the checking units of the checker 102, so as to generate the first output S1. Subsequently, it is executing the logical exclusive OR operation for the second sampled data signal and the first sampled edge signal via the checking units, so as to generate the second output S2. Finally, it is executing the logical AND operation for the first output S1 and the second output S2 via the checking units, so as to generate the checking results.

In embodiment, after the unlock-detecting result Sout is generated via the comparator 106, it is determining whether an unlock state is incurred or not via the unlock detector 100A. When the unlock-detecting result Sout represents that the counting value in a period is larger than the default threshold, if is determining that the unlock state is incurred via the unlock detector 100A; when the unlock-detecting result Sout represents that the counting value is smaller or equal to the default threshold in a period, it is determining that the unlock state is not incurred via the unlock detector 100A. It should be noted that, the representation of the unlock-detecting result Sout mentioned above is used for illustration, but the present disclosure is not limited thereto.

In one embodiment, the unlock-detecting method 300 is performed by the eraser 108 to erase the unlock-detecting result Sout generated from the comparator 106, so as to reset the comparator 106 to regenerate another unlock-detecting result Sout. In one embodiment, after the unlock-detecting result Sout is generated via the comparator 106, and it is determining that the unlock state is not incurred via the unlock detector 100A, the unlock-detecting result Sout is erased by the eraser 108 to reactivate the unlock detector 100A to detect the unlock state. In another embodiment, the eraser 108 sent an erased signal after a period of time repeatedly, and the unlock-detecting result Sout is erased by the eraser 108 to reactivate the unlock detector 100A to detect the unlock state. After the unlock-detecting result Sout is generated via the comparator 106, and it is determining that the unlock state is incurred via the unlock detector 100A, the clock and data recovery circuit immediately stops operating and corrects the unlock state.

As mentioned above, the unlock detector of the present disclosure detects unlock for the clock and data recovery circuit according to the sampled data signal and the sampled edge signal, and the sampled data signal and the sampled edge signal are generated from the clock and data recovery circuit. Therefore, the unlock detector and the unlock-detecting method of the present disclosure can effectively avoid the clock and data recovery circuit locks at a wrong sampling rate. Additionally, in comparison with a traditional unlock detector which operates according to a reference clock signal, the unlock detector of the present disclosure can be directly disposed in the clock and data recovery circuit without disposing an additional generating circuit configured to generate the reference clock signal, so as to dramatically reduce an area of the clock and data recovery circuit.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present invention cover modifications and variations of this present disclosure provided they fall within the scope of the following claims.

What is claimed is:

1. An unlock detector, comprising:
   a checker, comprising a plurality of checking circuits, wherein the checker is configured to receive a sampled data signal and a sampled edge signal, and to respectively check the sampled data signal and the sampled edge signal via the checking circuits to generate a plurality of checking results;
   an accumulator, electrically connected to the checker, and configured to perform counting according to the checking results for generating a counting value; and
   a comparator, electrically connected to the accumulator, and configured to compare the counting value with a threshold to generate an unlock-detecting result;
   wherein each of the checking circuits executes a logical exclusive NOR operation for a respective first sampled data signal and a respective second sampled data signal of the sampled data signal to generate a first output, each of the checking circuits executes a logical exclusive OR operation for the respective second sampled data signal and a respective first sampled edge signal of the sampled edge signal to generate a second output, and each of the checking circuits executes a logical AND operation for the first output and the second output to generate a respective one of the checking results.

2. The unlock detector of claim 1, wherein each of the checking circuits further comprises:
   a logical AND gate, electrically connected to the accumulator;
   a logical exclusive NOR gate, electrically connected to the logical AND gate, and configured to receive the respective first sampled data signal and the respective second sampled data signal of the sampled data signal; and
   a logical exclusive OR gate, electrically connected to the logical AND gate, and configured to receive the respective second sampled data signal of the sampled data signal and the respective first sampled edge signal of the sampled edge signal, wherein the logical exclusive OR gate is parallel with the logical exclusive NOR gate.

3. The unlock detector of claim 2, wherein the counting value is a nonnegative integer, when the counting value is larger than the threshold, the unlock detector determines that an unlock state is incurred; when the counting value is smaller than or equal to the threshold, the unlock detector determines that the unlock state is not incurred.

4. The unlock detector of claim 1, further comprising:
   an eraser, electrically connected to the comparator, and configured to erase the unlock-detecting result generated from the comparator.

5. An unlock-detecting method, comprising:
   receiving a sampled data signal and a sampled edge signal;
   checking the sampled data signal and the sampled edge signal to generate a plurality of checking results;
   performing counting according to the checking results in a period to generate a counting value; and
   comparing the counting value with a threshold to generate an unlock-detecting result;
   wherein checking the sampled data signal and the sampled edge signal to generate the checking results comprises:
   retrieving a plurality of first sampled data signals and a plurality of second sampled data signals of the sampled data signal and a respective first sampled edge signal of the sampled edge signal;
   generating a plurality of first outputs and a plurality of second outputs according to the plurality of first sampled data signals, the first sampled edge signal and the plurality of second sampled data signals; and
   generating the checking results according to the first outputs and the second outputs.

6. The unlock-detecting method of claim 5, wherein checking the sampled data signal and the sampled edge signal to generate the checking results further comprises:

executing a plurality of logical exclusive NOR operations for the plurality of first sampled data signals and the plurality of second sampled data signals to generate the first outputs;
executing a plurality of logical exclusive OR operations for the plurality of second sampled data signals and the respective first sampled edge signal to generated the second outputs; and
executing a plurality of logical AND operations for the first outputs and the second outputs to generate the checking results.

7. The unlock-detecting method of claim 6, wherein comparing the counting value with the threshold to generate the unlock-detecting result comprises:
when the counting value in a period is larger than the threshold, determining that an unlock state is incurred;
when the counting value is smaller than or equal to the threshold in a period, determining that the unlock state is not incurred, wherein the counting value is a non-negative integer.

8. The unlock-detecting method of claim 5, further comprising:
erasing the unlock-detecting result when it is determining that an unlock state is not incurred after the unlock-detecting result is generated.

9. A clock and data recovery circuit, comprising:
a signal sampler, configured to generate a sampled data signal and a sampled edge signal according to a data signal and a clock signal;
a phase detector, configured to generate an error signal according to the sampled data signal and the sampled edge signal;
a loop filter, configured to generate an adjusting signal according to the error signal;
a phase adjuster, configured to generate a renewal signal according to the adjusting signal;
a clock signal generator, configured to generate the clock signal, and to adjust the clock signal according to the renewal signal; and
an unlock detector, comprising:
a checker, comprising a plurality of checking circuits, wherein the checker is configured to receive the sampled data signal and the sampled edge signal, and to check the sampled data signal and the sampled edge signal via the checking circuits to generate a plurality of checking results;
an accumulator, electrically connected to the checker, and configured to perform counting according to the checking results for generating a counting value; and
a comparator, electrically connected to the accumulator, and configured to compare the counting value with a threshold to generate an unlock-detecting result;
wherein each of the checking circuits of the checker executes a logical exclusive NOR operation for a respective first sampled data signal and a respective second sampled data signal of the sampled data signal to generate a first output, each of the checking circuits of the checker executes a logical exclusive OR operation for the respective second sampled data signal and a respective first sampled edge signal of the sampled edge signal to generate a second output, and each of the checking circuits of the checker executes a logical AND operation for the first output and the second output to generate a respective one of the detecting results.

10. The clock and data recovery circuit of claim 9, wherein each of the checking circuits of the checker further comprises:
a logical AND gate, electrically connected to the accumulator;
a logical exclusive NOR gate, electrically connected to the logical AND gate, and configured to receive the respective first sampled data signal and the respective second sampled data signal of the sampled data signal; and
a logical exclusive OR gate, electrically connected to the logical AND gate, and configured to receive the respective second sampled data signal of the sampled data signal and the respective first sampled edge signal of the sampled edge signal, wherein the logical exclusive OR gate is parallel with the logical exclusive NOR gate.

11. The clock and data recovery circuit of claim 10, wherein the counting value is a nonnegative integer, when the counting value is larger than the threshold, the unlock detector determines that an unlock state is incurred, and the clock and data recovery circuit stops operating and corrects the unlock state; when the counting value is smaller than or equal to the threshold, the unlock detector determines that the unlock state is not incurred, and the clock and data recovery circuit keeps operating.

12. The clock and data recovery circuit of claim 9, wherein the unlock detector further comprises:
an eraser, electrically connected to the comparator, and configured to erase the unlock-detecting result generated from the comparator.

* * * * *